(12) United States Patent
Yang et al.

(10) Patent No.: US 12,512,262 B2
(45) Date of Patent: Dec. 30, 2025

(54) MULTILAYER ELECTRONIC COMPONENT

(71) Applicant: SAMSUNG ELECTRO-MECHANICS CO., LTD., Suwon-si (KR)

(72) Inventors: Chan Ho Yang, Suwon-si (KR); Min Jun Kim, Suwon-si (KR); Jung Mi Baek, Suwon-si (KR); Da Eun Kim, Suwon-si (KR); Hye Min Park, Suwon-si (KR); Jong Min Kim, Suwon-si (KR); Seong Hyeon Cho, Suwon-si (KR); Min San Seo, Suwon-si (KR); Hong Seok Kim, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 218 days.

(21) Appl. No.: 18/081,962

(22) Filed: Dec. 15, 2022

(65) Prior Publication Data

US 2023/0207191 A1    Jun. 29, 2023

(30) Foreign Application Priority Data

Dec. 29, 2021    (KR) .................. 10-2021-0190973

(51) Int. Cl.
| H01G 2/08 | (2006.01) |
| H01G 2/14 | (2006.01) |
| H01G 4/258 | (2006.01) |
| H01G 4/30 | (2006.01) |
| H01G 4/40 | (2006.01) |

(Continued)

(52) U.S. Cl.
CPC ................. *H01G 2/08* (2013.01); *H01G 2/14* (2013.01); *H01G 4/258* (2013.01); *H01G 4/30* (2013.01); *H01G 4/40* (2013.01); *H10N 10/13* (2023.02); *H10N 10/17* (2023.02); *H01G 4/248* (2013.01)

(58) Field of Classification Search
None
See application file for complete search history.

(56) References Cited

U.S. PATENT DOCUMENTS 3,321,696 A * 5/1967 Abe ...................... H10N 10/00
                                              363/140
8,008,894 B2    8/2011 Sartore
(Continued)

FOREIGN PATENT DOCUMENTS

| CN | 101014539 A | * | 8/2007 | ........... C01G 23/006 |
| CN | 101048345 A | * | 10/2007 | ........... C01G 23/006 |

(Continued)

OTHER PUBLICATIONS

Englsih Translation of JP2002118297.*
(Continued)

*Primary Examiner* — Eric W Thomas
(74) *Attorney, Agent, or Firm* — Morgan Lewis & Bockius LLP

(57) ABSTRACT

A multilayer electronic component includes a body including dielectric layers and a plurality of internal electrodes stacked on each other in a first direction, and having a respective one of the dielectric layers interposed therebetween; a thermoelectric element disposed inside the body; and external electrodes disposed outside the body.

25 Claims, 5 Drawing Sheets

(51) Int. Cl.
*H10N 10/13* (2023.01)
*H10N 10/17* (2023.01)
*H01G 4/248* (2006.01)

(56) References Cited

U.S. PATENT DOCUMENTS

| | | | | |
|---|---|---|---|---|
| 2002/0046861 | A1* | 4/2002 | Yokoyama | H01G 4/232 |
| | | | | 174/565 |
| 2012/0281335 | A1* | 11/2012 | Engel | H01G 4/258 |
| | | | | 361/274.1 |
| 2018/0368293 | A1 | 12/2018 | Bultitude et al. | |
| 2020/0006002 | A1* | 1/2020 | Itamochi | H01G 2/065 |

FOREIGN PATENT DOCUMENTS

| | | | | |
|---|---|---|---|---|
| JP | 2002118297 | A | * | 4/2002 |
| JP | 2002260953 | A | * | 9/2002 |
| JP | 2003-008087 | A | | 1/2003 |
| KR | 10-2020-0067811 | A | | 6/2020 |

OTHER PUBLICATIONS

I-Yu Huang, et al., "Development of low-cost micro-thermoelectric coolers utilizing MEMS technology," Sensors and Actuators A: Physical, 2008, No. 148, pp. 176-185.

Korean Office Action dated Jun. 19, 2025 issued in Korean Patent Application No. 10-2021-0190973 (with English translation).

Y. Hee-jin, "Cooler manufacturing technology for sub-notebook heat dissipation," Planning/serialization Enterprise, Feb. 17, 2008 (with English translation).

"Development of Bi-Te thermoelectric devices and materials with enhanced properties for convergence with solar cells," Research Program for New Drug Target Discovery, 2012 Summary / contents translation.

T. Wu, et al., "Development of Perovskite-Type Materials for Thermoelectric Application," MDPI, No. 11, vol. 999, 2018.

H. Wang, et al., "Recent development of n-type perovskite thermoelectrics," ScienceDirect, J. Materiomics, 2016, No. 2, pp. 225-236.

-Yu Huang, et al., "Development of low-cost micro-thermoelectric coolers utilizing MEMS technology," Sensors and Actuators A: Physical, 2008, No. 148, pp. 176-185.

M. Sajid, et al., "An overview of cooling of thermoelectric device," Renewable and Sustainable Energy Reviews, 2017, No. 78, pp. 15-22.

Y. Lee, et al., "Efficient Thermoelectric Cooling for Mobile Devices," IEEE, 2017.

H. Kattan, et al., "On-demand Mobile CPU Cooling with Thin-Film Thermoelectric Array," IEEE Micro, 2021.

G. J. Snyder, et al., "Hot Spot Cooling using Embedded Thermoelectric Coolers," 22nd IEEE Semi-Therm Symposium, 2006.

P. Wang, et al., "On-chip hot spot cooling using silicon thermoelectric microcoolers," Journal of Applied Physics, No. 102, 2007.

* cited by examiner

MULTILAYER ELECTRONIC COMPONENT

CROSS-REFERENCE TO RELATED APPLICATION(S)

This application claims the benefit of priority to Korean Patent Application No. 10-2021-0190973 filed on Dec. 29, 2021 in the Korean Intellectual Property Office, the disclosure of which is incorporated herein by reference in its entirety.

TECHNICAL FIELD

The present disclosure relates to a multilayer electronic component.

BACKGROUND

A multilayer ceramic capacitor (MLCC), a multilayer electronic component, may be a chip-type condenser mounted on the printed circuit boards of various electronic products, such as an image display device such as a liquid crystal display (LCD) or a plasma display panel (PDP), a computer, a smartphone or a cellular phone, serving to charge or discharge electricity therein or therefrom.

In recent years, the multilayer ceramic capacitor has been used as a component of various electronic devices, and is required to have high reliability in a harsh environment of a vehicle or infotainment system, especially in a high-temperature environment, as the technical field thereof has increasing interest in electronic components for vehicles.

However, a surface temperature of the multilayer ceramic capacitor may be rapidly increased as a leakage current is continuously increased when a voltage is applied to the capacitor. In consideration of this situation, there is thus a need for conducting research on a multilayer ceramic capacitor capable of maintaining a constant internal temperature of a body which forms capacitance of the capacitor by including a dielectric layer and internal electrodes.

SUMMARY

An aspect of the present disclosure may provide a multilayer electronic component having improved reliability in a high-temperature environment by maintaining a constant internal temperature of a body.

However, the present disclosure is not limited to the description above, and may be more readily understood in the description of exemplary embodiments of the present disclosure.

According to an aspect of the present disclosure, a multilayer electronic component may include a body including dielectric layers and a plurality of internal electrodes stacked on each other in a first direction, and having a respective one of the dielectric layers interposed therebetween; a thermoelectric element disposed inside the body; and external electrodes disposed outside the body.

The thermoelectric element may include a first-type semiconductor element, a second-type semiconductor element, and a connection electrode connecting the first-type and second-type semiconductor elements to each other.

The body may include a capacitance formation portion including the plurality of internal electrodes, and first and second cover portions disposed on opposite surfaces of the capacitance formation portion in the first direction, and the thermoelectric element may be disposed on at least one of the first cover portion or the second cover portion.

The thermoelectric element may include a first electrode connected to the first-type semiconductor element and a second electrode connected to the second-type semiconductor element, and the first electrode and the second electrode may be respectively connected to the external electrodes.

The thermoelectric element may include the plurality of first-type semiconductor elements, the plurality of second-type semiconductor elements, and the plurality of connection electrodes.

A plurality of thermoelectric elements may be disposed in the body.

The plurality of thermoelectric elements may include a first thermoelectric element and a second thermoelectric element respectively disposed in the first cover portion and the second cover portion.

The first thermoelectric element and the second thermoelectric element may be provided in plural, and the plurality of first thermoelectric elements and the plurality of second thermoelectric elements may be respectively disposed in the first cover portion and the second cover portion.

The thermoelectric element may not be exposed to any of opposite surfaces of the body in the first direction.

The first-type semiconductor element may be an N-type semiconductor element, and the second-type semiconductor element may be a P-type semiconductor element.

The multilayer electronic component may further include a filling portion disposed in a level between the connection electrode disposed on first end surfaces of a pair of the first-type and second-type semiconductor elements and another connection electrode disposed on second end surfaces of an adjacent pair of the first-type and second-type semiconductor elements.

The first or second-type semiconductor element may include perovskite oxide.

The first electrode, the second electrode and the connection electrode may each include at least one of silver (Ag), copper (Cu), nickel (Ni) or an alloy thereof.

The first and second cover portions may each have a thickness of 30 μm or less.

Each of the external electrodes may include a first electrode layer disposed on the body and including a conductive metal and glass and a second electrode layer disposed on the first electrode layer and including a conductive metal.

The second electrode layer may be a multilayer including a first layer including nickel (Ni) as the conductive metal and a second layer including tin (Sn) as the conductive metal.

According to another aspect of the present disclosure, a multilayer electronic component may include a body including a capacitance formation portion having dielectric layers and a plurality of internal electrodes stacked on each other in a first direction, and having a respective one of the dielectric layers interposed therebetween, the body further including at least one cover portion disposed above or below the capacitance formation portion in the first direction; at least one thermoelectric element disposed in the at least one cover portion of the body; and external electrodes disposed outside the body.

According to still another aspect of the present disclosure, a multilayer electronic component may include a body including dielectric layers and a plurality of first and second internal electrodes alternately stacked with a respective one of the dielectric layers interposed therebetween in a first direction; external electrodes disposed outside the body and having inner surfaces respectively connected to the plurality of first and second internal electrodes; and a thermoelectric element connected to the inner surfaces of the external electrodes.

BRIEF DESCRIPTION OF DRAWINGS

The above and other aspects, features and advantages of the present disclosure will be more clearly understood from the following detailed description taken in conjunction with the accompanying drawings, in which.

DETAILED DESCRIPTION

Figure 1:
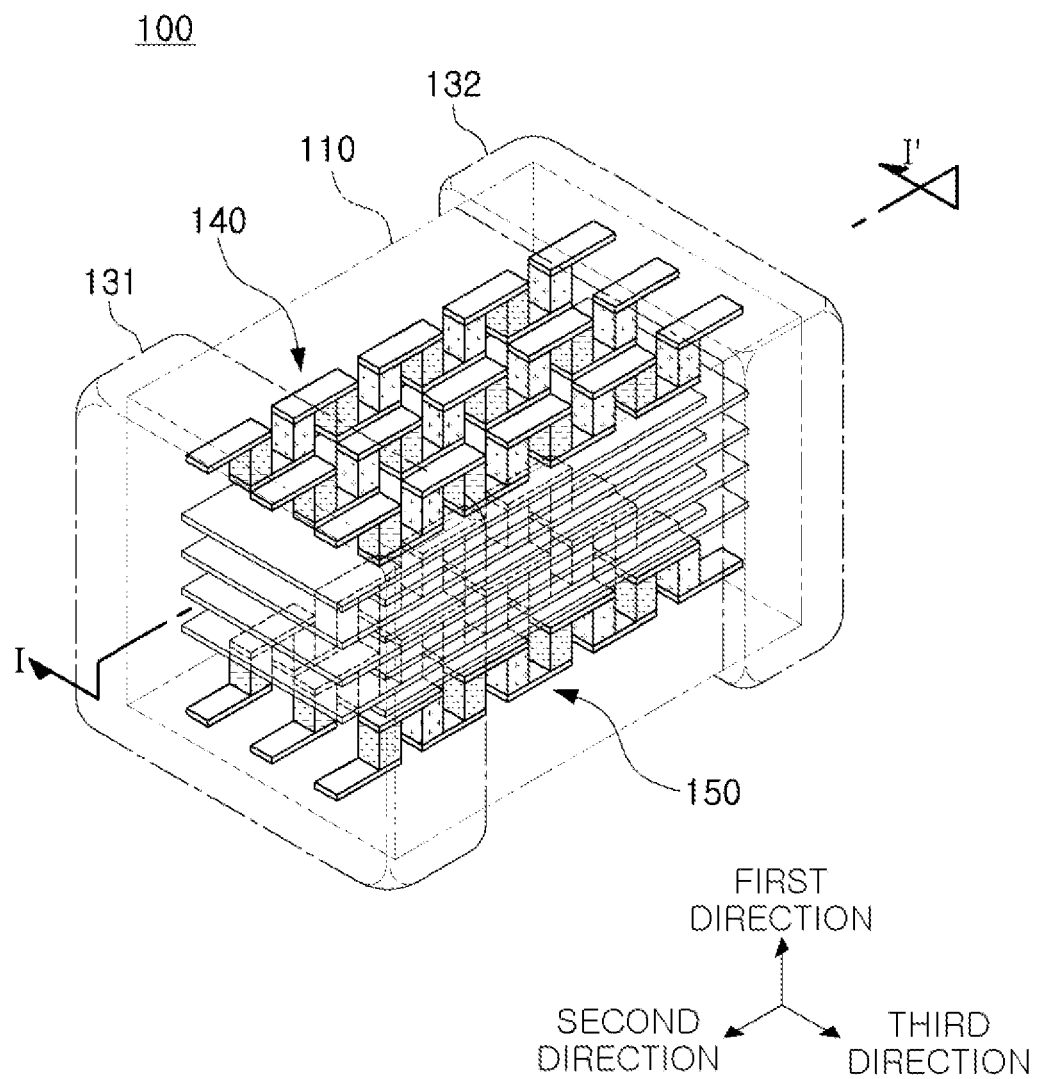
FIG. 1 is a perspective view schematically showing a multilayer electronic component according to an exemplary embodiment of the present disclosure.

Hereinafter, exemplary embodiments of the present disclosure will now be described in detail with reference to the accompanying drawings.

In the drawings, a first direction may indicate a thickness (T) direction, a second direction may indicate a length (L) direction, and a third direction may indicate a width (W) direction.

Figure 2:
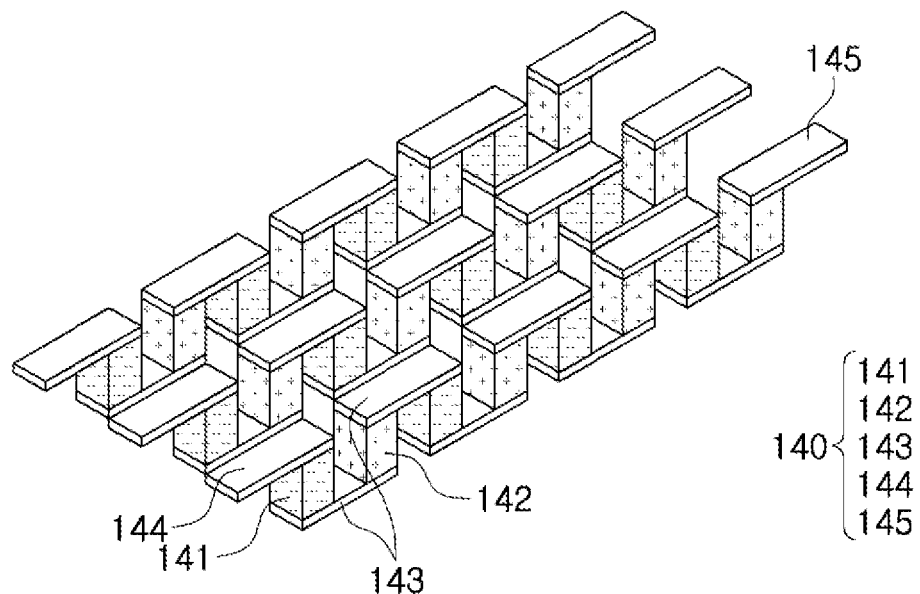
FIGS. 2 and 3 are perspective views each schematically showing a thermoelectric element of the multilayer electronic component.
Figure 3:
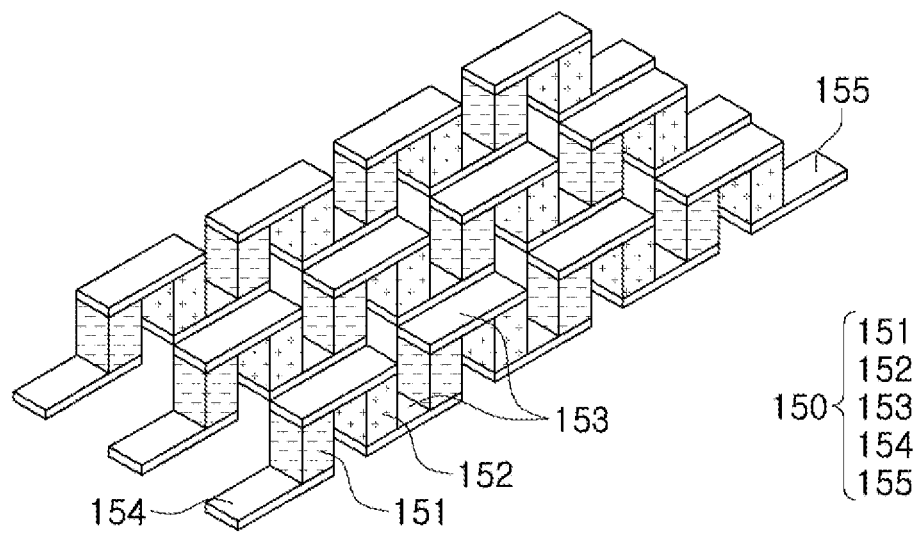
Figure 4:
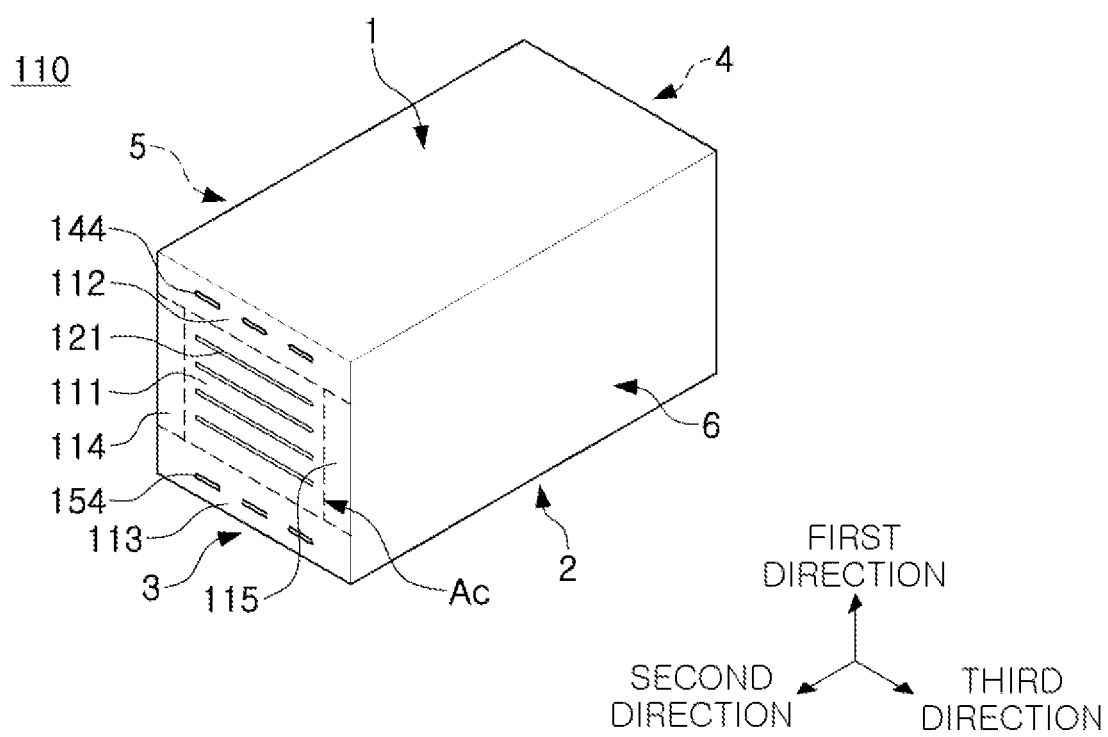
FIG. 4 is a perspective view schematically showing a body of the multilayer electronic component.
Figure 5:
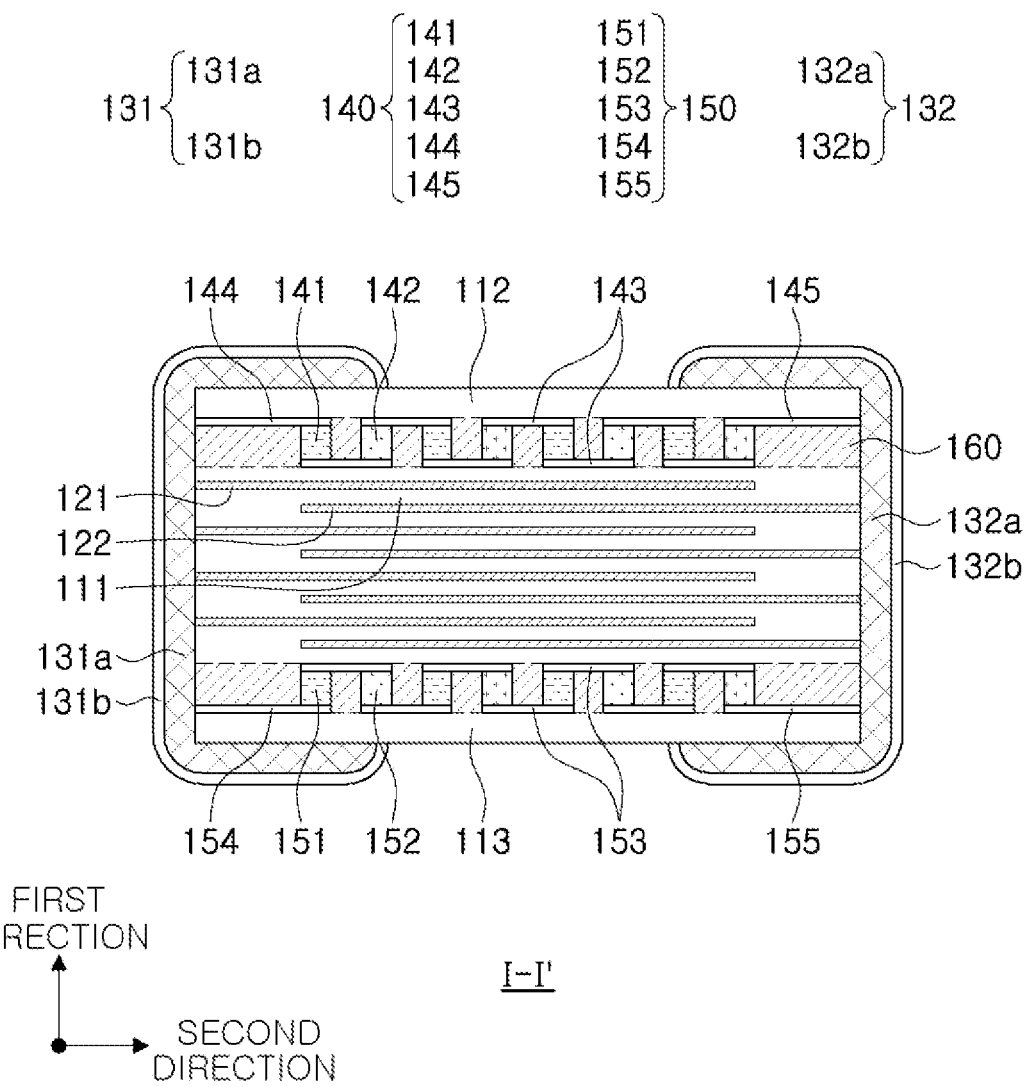
FIG. 5 is a cross-sectional view taken along line I-I' of FIG. 1.
Figure 6A:
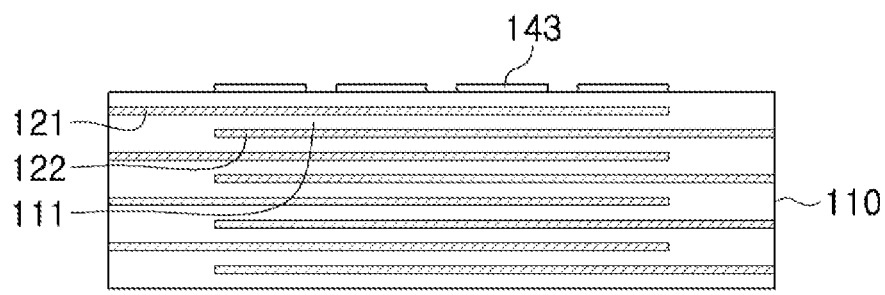
FIGS. 6A, 6B, 6C and 6D are cross-sectional views each schematically showing a method of manufacturing the multilayer electronic component according to an exemplary embodiment of the present disclosure.
Figure 6B:
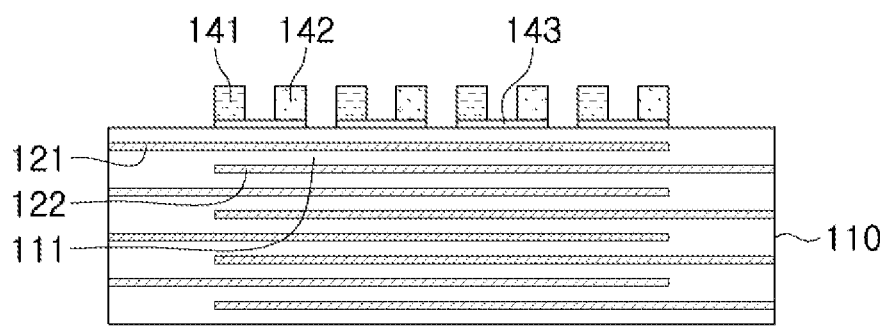
Figure 6C:
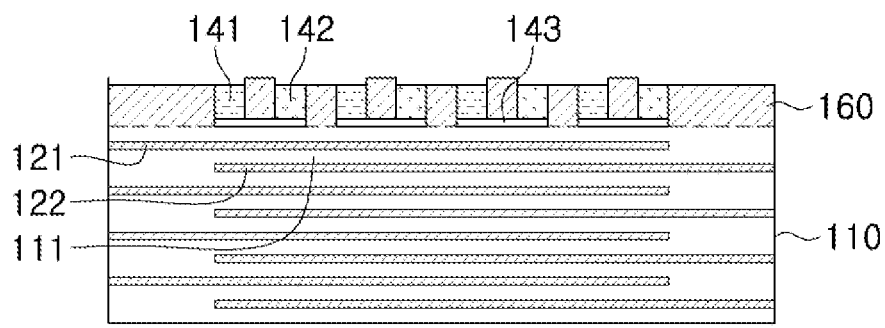
Figure 6D:
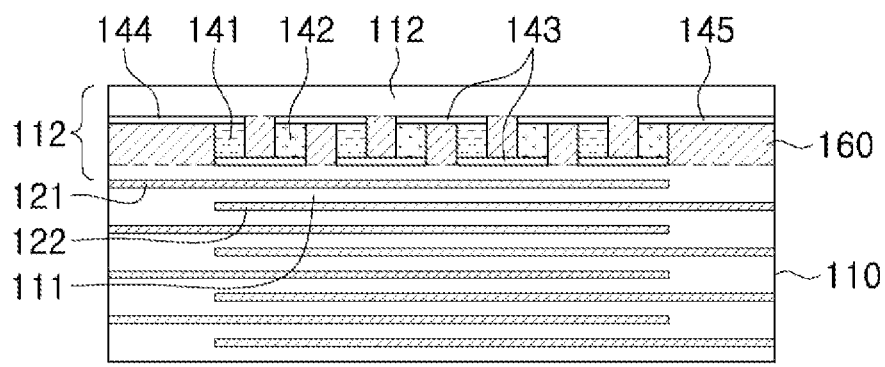

FIG. 1 is a perspective view schematically showing a multilayer electronic component according to an exemplary embodiment of the present disclosure;

FIGS. 2 and 3 are perspective views each schematically showing a thermoelectric element of the multilayer electronic component;

FIG. 4 is a perspective view schematically showing a body of the multilayer electronic component; and FIG. 5 is a cross-sectional view taken along line I-I' of FIG. 1.

Referring to FIGS. 1 through 5, a multilayer electronic component 100 according to an exemplary embodiment of the present disclosure may include: a body 110 including dielectric layers 111 and a plurality of internal electrodes 121 and 122 stacked on each other in the first direction, while having the dielectric layer 111 interposed therebetween; a thermoelectric element 140 or 150 disposed inside the body 110; and external electrodes 131 and 132 disposed outside the body 110.

As described above, the multilayer electronic component is required to have high reliability in a high-temperature environment. However, a surface temperature of a multilayer ceramic capacitor, one of the multilayer electronic components, may be rapidly increased as a leakage current is continuously increased when a voltage is applied to the capacitor.

On the other hand, the multilayer electronic component 100 according to an exemplary embodiment of the present disclosure may maintain a constant internal temperature of the body 110, in particular, a constant temperature of a capacitance formation portion Ac by disposing the thermoelectric elements 140 and 150 inside the body 110.

Hereinafter, the description more specifically describes each component included in the multilayer electronic component 100 according to an exemplary embodiment of the present disclosure.

The body 110 is not limited to a particular shape, and may have a hexahedral shape or a shape similar to the hexahedral shape, as shown in the drawings. The body 110 may not have a shape of the hexahedron having perfectly straight lines because a ceramic powder included in the body 110 is contracted or its edge is polished in a process in which the body is sintered. However, the body 110 may substantially have the hexahedral shape.

The body 110 may have first and second surfaces 1 and 2 opposing each other in the first direction, third and fourth surfaces 3 and 4 connected to the first and second surfaces 1 and 2 and opposing each other in the second direction, and fifth and sixth surfaces 5 and 6 connected to the first to fourth surfaces 1, 2, 3 and 4, and opposing each other in the third direction.

The body 110 may include the dielectric layer 111 and the internal electrode 121 or 122, which are alternately stacked on each other. The plurality of dielectric layers 111 included in the body 110 may already be sintered, and adjacent dielectric layers 111 may thus be integrated with each other, thus making it difficult to confirm a boundary therebetween without using the scanning electron microscope (SEM).

The dielectric layer 111 may be formed by sintering a ceramic green sheet including a ceramic powder, an organic solvent, and a binder. The ceramic powder is not particularly limited as long as the capacitor obtains sufficient capacitance, and may use, for example, a barium titanate ($BaTiO_3$)-based material, a strontium titanate ($SrTiO_3$)-based material or the like. However, the present disclosure is not limited thereto.

In this case, a thickness of the dielectric layer 111 may be 10 μm or less in consideration of the size and capacitance of the body 110, and may be 0.6 μm or less, or 0.4 μm or less in order for the multilayer electronic component 100 to have a smaller size and higher capacitance. However, the present disclosure is not limited thereto.

Here, the thickness of the dielectric layer 111 may indicate an average thickness of the dielectric layers 111 disposed between the internal electrodes 121 and 122. The thickness of the dielectric layer 111 may be measured by scanning a cross section of the body 110 in a first-second direction by using a scanning electron microscope (SEM) with a magnification of 10,000. In more detail, an average thickness value of the dielectric layer 111 may be obtained by averaging the thicknesses of one dielectric layer measured at a plurality of points, for example, at thirty equally spaced points (but not limited thereto) in the second direction. In addition, it is possible to obtain the more general average thickness of the dielectric layer when measuring the average value by extending a measurement target of the average value to the plurality of dielectric layers. Other measurement methods and/or tools appreciated by one of ordinary skill in the art, even if not described in the present disclosure, may also be used.

The body 110 may include the capacitance formation portion Ac disposed in the body 110, and forming the capacitance of the capacitor by including the plurality of first and second internal electrodes 121 and 122 disposed to oppose each other interposing the dielectric layer 111 therebetween, and a first cover portion 112 disposed on an upper surface of the capacitance formation portion Ac and a second cover portion 113 disposed on a lower surface of the capacitance formation portion Ac. That is, the cover portions 112 and 113 may respectively indicate areas from opposite surfaces of the capacitance formation portion Ac in the first direction to opposite surfaces of the body 110 in the first direction. The first cover portion 112 and the second cover portion 113 may basically serve to prevent damage to the internal electrodes, caused by physical or chemical stress. The first and second cover portions 112 and 113 may each have a thickness of 300 μm or less, 100 μm or less, or 30 μm or less in consideration of the size and capacitance of the body 110. However, the present disclosure is not limited thereto. Here, each thickness of the first and second cover portions 112 and 113 may indicate an average thickness of the first and second cover portions 112 and 113, and the thickness may here indicate a length of the cover portion in the first direction. The average thickness of the first and second cover portions 112 and 113 may indicate an average thickness value obtained by averaging the thicknesses of the cover portion measured at thirty equally spaced points (but not limited thereto) in the second direction, based on the cross section of the body 110 in the first-second direction obtained by using an optical microscope or a scanning electron microscope (SEM). Other measurement methods and/or tools appreciated by one of ordinary skill in the art, even if not described in the present disclosure, may also be used.

The body 110 may further include margin portions 114 and 115 each disposed on a side of the capacitance formation portion Ac based on the third direction. The margin portions 114 and 115 may include the margin portion 114 disposed on the fifth surface 5 of the body 110 and the margin portion 115 disposed on the sixth surface 6 of the body 110. The margin portion 114 or 115 may basically serve to prevent the damage to the internal electrode 121 or 122, caused by the physical or chemical stress. The margin portion 114 or 115 may include the same or different material as the dielectric layer 111. The margin portion 114 or 115 maybe formed by forming the internal electrode by applying a conductive paste on the ceramic green sheet except for a portion where the margin portion is to be positioned. A thickness of the margin portion 114 or 115 may be 300 μm or less, 100 μm or less, or 30 μm or less in consideration of the size and capacitance of the body 110. However, the present disclosure is not limited thereto. Here, each thickness of the margin portions 114 and 115 may indicate an average thickness, and the thickness may here indicate a length of the margin portion 114 or 115 in the third direction. The average thickness of each of the margin portions 114 and 115 may indicate an average thickness value obtained by averaging the thicknesses of the margin portion measured at thirty equally spaced points (but not limited thereto) in the first direction, based on the cross section of the body 110 in the first-third direction obtained by using an optical microscope or a scanning electron microscope (SEM). Other measurement methods and/or tools appreciated by one of ordinary skill in the art, even if not described in the present disclosure, may also be used.

The internal electrode 121 or 122 may be alternately disposed with the dielectric layer 111, and the plurality of first internal electrodes 121 and the plurality of second internal electrodes 122 may be disposed to oppose each other interposing the dielectric layer 111 therebetween. That is, the first and second internal electrodes 121 and 122 may be a pair of electrodes having polarities different from each other, and may be exposed alternately through the third and fourth surfaces 3 and 4 of the body 110 along a stack direction of the dielectric layers 111.

For example, each of the plurality of first internal electrodes 121 may be spaced apart from the fourth surface 4 and exposed through the third surface 3. In addition, each of the plurality of second internal electrodes 122 may be spaced apart from the third surface 3 and exposed through the fourth surface 4. The plurality of first internal electrodes 121 and the plurality of second internal electrodes 122 may be electrically insulated from each other by the dielectric layer 111 interposed therebetween. The plurality of first internal electrodes 121 and the plurality of second internal electrodes 122 may be alternately stacked on each other in the first direction, are not limited thereto, and may be alternately stacked on each other in the third direction.

The internal electrode 121 or 122 may be formed by printing, on the ceramic green sheet, the conductive paste for an internal electrode including a conductive metal to a predetermined thickness. The capacitance formation portion Ac of the body 110 may be formed by alternately stacking the ceramic green sheets on each of which the internal electrode 121 or 122 is printed on each other and sintering the same. A method of printing the conductive paste for an internal electrode may be a screen printing method or a gravure printing method. However, the present disclosure is not limited thereto.

The conductive metal included in the internal electrode 121 or 122 may be at least one of nickel (Ni), copper (Cu), palladium (Pd), silver (Ag), gold (Au), platinum (Pt), tin (Sn), tungsten (W), titanium (Ti) or an alloy thereof. However, the present disclosure is not limited thereto.

Here, a thickness of the internal electrode 121 or 122 may be 10 μm or less in consideration of the size and capacitance of the body 110, and may be 0.6 μm or less, or 0.4 μm or less in order for the multilayer electronic component 100 to have the smaller size and the higher capacitance. However, the present disclosure is not limited thereto.

Here, the thickness of the internal electrode 121 or 122 may indicate an average thickness of the internal electrode 121 or 122. The thickness of the internal electrode 121 or 122 may be measured by scanning the cross section of the body 110 in the first-second direction by using the scanning electron microscope with a magnification of 10,000. In more detail, an average thickness value of the internal electrode may be obtained by averaging the thicknesses of one internal electrode measured at a plurality of points, for example, at thirty equally spaced points (but not limited thereto) in the second direction. In addition, it is possible to obtain the more general average thickness of the internal electrode when measuring its average value by extending a measurement target of the average value to the plurality of internal electrodes. Other measurement methods and/or tools appreciated by one of ordinary skill in the art, even if not described in the present disclosure, may also be used.

The external electrodes 131 and 132 may respectively be disposed on the third and fourth surfaces 3 and 4 of the body 110, and partially extended to the first, second, fifth and sixth surfaces 1, 2, 5 and 6 of the body 110. The external electrodes 131 and 132 may include the first external electrode 131 and the second external electrode 132 respectively connected to the plurality of first internal electrodes 121 and the plurality of second internal electrodes 122.

The external electrode 131 or 132 may be made of any material having electrical conductivity, such as a metal, may use a specific material determined in consideration of electrical characteristics, structural stability or the like, and may have a multilayer structure. For example, the external electrode 131 or 132 may include a first electrode layer 131a or 132a disposed on the body 110 and including the conductive metal and glass and a second electrode layer 131b or 132b disposed on the first electrode layer 131a or 132a and including the conductive metal.

The conductive metal of the first electrode layer 131a or 132a may include, for example, copper (Cu), nickel (Ni), palladium (Pd), platinum (Pt), gold (Au), silver (Ag), lead (Pb) and/or an alloy thereof, or may include copper (Cu) and/or nickel (Ni). However, the present disclosure is not limited thereto. The first electrode layer 131a or 132a may be formed by dipping the third and fourth surfaces 3 and 4 of the body 110 in the conductive paste including the conductive metal and glass and then firing the same. Alternatively, the first electrode layer may be formed by transferring a sheet including the conductive metal and glass. Accordingly, the first electrode layer 131a or 132a may be a fired electrode.

The second electrode layer 131b or 132b may improve mountability of the capacitor. The second electrode layer 131b or 132b is not limited to a particular type, may be a plating layer including nickel (Ni), tin (Sn), palladium (Pd) and/or an alloy thereof, and may be a multilayer. The second electrode layer 131b or 132b may be, for example, a nickel (Ni) plating layer or a tin (Sn) plating layer, and may be formed by sequentially disposing the nickel (Ni) plating layer and the tin (Sn) plating layer. Alternatively, the second electrode layer 131b or 132b may include a plurality of nickel (Ni) plating layers and/or a plurality of tin (Sn) plating layers.

This exemplary embodiment describes that the multilayer electronic component 100 includes two external electrodes 131 and 132. However, the present disclosure is not limited thereto, and the number, shape or the like of the external electrode 131 or 132 may depend on a shape of the internal electrode 121 or 122 or another purpose.

The multilayer electronic component 100 according to an exemplary embodiment of the present disclosure may include the thermoelectric elements 140 and 150 disposed inside the body 110. The inside of the body 110 in which the thermoelectric elements 140 and 150 are disposed may indicate, for example, the first cover portion 112 and/or the second cover portion 113 disposed on the opposite surfaces of the capacitance formation portion Ac in the first direction. That is, the thermoelectric element 140 or 150 may be disposed on at least one of the first cover portion 112 or the second cover portion 113. When the thermoelectric element 140 or 150 is disposed on at least one of the first cover portion 112 or the second cover portion 113, the thermoelectric element 140 or 150 may not be exposed to any of the opposite surfaces of the body 110 in the first direction, i.e., the first or second surface 1 or 2. Alternatively, the thermoelectric elements 140 and 150 may respectively be disposed in the first and second cover portions 112 and 113. Here, the thermoelectric elements 140 and 150 may include the first thermoelectric element 140 disposed in the first cover portion 112 and the second thermoelectric element 150 disposed in the second cover portion 113. Here, the plurality of thermoelectric elements 140 and 150 maybe disposed in the body 110. For example, the plurality of first thermoelectric elements 140 may be disposed in the first cover portion 112, and the plurality of second thermoelectric elements 150 may be disposed in the second cover portion 113. The number of each of the first thermoelectric elements 140 and the second thermoelectric elements 150 may be appropriately selected in consideration of a length of the body 110 in the third direction, and may be, for example, two or more, or three or more, or four or more. However, the present disclosure is not limited thereto.

In an exemplary embodiment of the present disclosure, the thermoelectric element 140 or 150 may include a first-type semiconductor element 141 or 151, a second-type semiconductor element 142 or 152, and a connection electrode 143 or 153 connecting the first-type and second-type semiconductor elements to each other. Here, the thermoelectric element 140 or 150 may include the plurality of first-type semiconductor elements 141 or 151, the plurality of second-type semiconductor elements 142 or 152, and the plurality of connection electrodes 143 or 153. When the plurality of first-type and second-type semiconductor elements are disposed in the body, the plurality of first-type semiconductor elements 141 or 151 and the plurality of second-type semiconductor elements 142 or 152 may be alternately disposed in the second direction. The number of each of the first-type and second-type semiconductor elements may be appropriately selected in consideration of a length of the body 110 in the second direction, and may be, for example, four or more. However, the present disclosure is not limited thereto.

The first-type semiconductor element 141 or 151 and the second-type semiconductor element 142 or 152 may be made of different semiconductor materials. For example, the first-type semiconductor element 141 or 151 may be an N-type semiconductor element, and the second-type semiconductor element 142 or 152 may be a P-type semiconductor element. In this case, the first-type semiconductor element and the second-type semiconductor element may form a unit cell.

The first-type semiconductor element 141 or 151 and the second-type semiconductor element 142 or 152 may be formed of a known thermoelectric material used in the art, and may include perovskite oxide. When formed of perovskite oxide, the first-type and second-type semiconductor elements may have higher stability in an oxidizing atmosphere and a high temperature. Here, perovskite oxide indicates an oxide having a structure expressed as $ABO_3$. Here, the N-type semiconductor element may include $Sr_xDy_{1-x}$, $Ba_xSr_yLa_{1-x-x-y}$, $Sr_xCa_yLa_{1-x-y}$, $Sr_xLa_{1-x}$, $Sr(Nb_xTi_{1-x})O_3$, $(Tb_xCa_{1-x})MnO_3$, $(Ca_xBi_{1-x})MnO_3$, $Ca(Ru_xMn_{1-x})O_3$, $(Ba_xLa_{1-x})SnO_3$, $(Sr_xLa_{1-x})SnO_3$ or the like. In addition, the P-type semiconductor element may include $Pr_xCa_{1-x})CoO_3$, $(Ho_xCa_{1-x})CoO_3$, $(La_xSr_{1-x})CoO_3$, $DyCoO_3$, $BaBi_{1-x}Sb_xO_3$ or the like.

The connection electrode 143 or 153 may electrically connect the first-type semiconductor element 141 or 151 and the second-type semiconductor element 142 or 152 to each other, and the plurality of connection electrodes 143 or 153 may be alternately disposed on one end surface and the other end surface of the first-type semiconductor element 141 or 151 and the second-type semiconductor element 142 or 152 to connect the plurality of first-type and second-type semiconductor elements to each other.

The connection electrode 143 or 153 may include at least one of silver (Ag), copper (Cu), nickel (Ni) or an alloy thereof as the conductive metal, and may include nickel (Ni). The conductive metal may have excellent electrical conductivity, and nickel (Ni) may effectively suppress element migration between the first-type semiconductor element 141 or 151 and the second-type semiconductor element 142 or 152.

An average thickness of the connection electrode 143 or 153 may be 10 μm or less, 0.6 μm or less, or 0.4 μm or less. The average thickness of the connection electrode 143 or 153 may be measured by scanning the cross section of the body 110 in the first-second direction by using the scanning electron microscope with a magnification of 10,000. In more detail, an average thickness value of the connection electrode 143 or 153 maybe obtained by averaging the thicknesses of one connection electrode measured at a plurality of points, for example, at thirty equally spaced points (but not limited thereto) in the second direction. In addition, it is possible to obtain the more general average thickness of the connection electrode when measuring its average value by extending a measurement target of the average value to multiple connection electrodes. Other measurement methods and/or tools appreciated by one of ordinary skill in the art, even if not described in the present disclosure, may also be used.

The thermoelectric element 140 or 150 may include a first electrode 144 or 154 connected to the first-type semiconductor element 141 or 151 and a second electrode 145 or 155 connected to the second-type semiconductor element 142 or 152. Here, the first electrode 144 or 154 and the second electrode 145 or 155 may respectively be connected to the external electrodes 131 and 132. The connection electrode 143 or 153 may include at least one of silver (Ag), copper (Cu), nickel (Ni) or the alloy thereof as the conductive metal, and may include nickel (Ni).

The first electrode 144 or 154 may be connected to the first external electrode 131, and the second electrode 145 or 155 may be connected to the second external electrode 132. However, the present disclosure is not limited to thereto, and the first electrode 144 or 154 may be connected to the second external electrode 132, and the second electrode 145 or 155 may be connected to the first external electrode 131. When the voltage is applied to the capacitor through the external electrode 131 or 132, the capacitance formation portion Ac may be operated by an AC voltage, and the thermoelectric element 140 or 150 may be operated by a direct voltage.

In more detail, when the voltage is applied to the first electrode 144 or 154 and the second electrode 145 or 155 of the thermoelectric element 140 or 150 through the external electrode 131 or 132, due to a Peltier effect, electrons in the N-type semiconductor element may be moved with heat to a positive electrode and holes in the P-type semiconductor element may be moved with heat to a negative electrode. Accordingly, the connection electrode 143 or 153, disposed on one end surface of each of the first-type semiconductor element 141 or 151 and the second-type semiconductor element 142 or 152 and adjacent to the capacitance formation portion Ac, may act as a cooling element by absorbing heat through an endothermic reaction. In addition, the connection electrode 143 or 153, disposed on the other end surface of each of the first-type semiconductor element 141 or 151 and the second-type semiconductor element 142 or 152 and adjacent to the first or second surface 1 or 2 of the body 110, may act as a heating element by dissipating heat through an exothermic reaction.

It is thus possible to maintain the constant internal temperature of the body 110 by cooling the capacitance formation portion Ac, a temperature of which is rapidly increased when the voltage is applied to the capacitor, and to provide the multilayer electronic component 100 having improved reliability even in the high-temperature environment. In addition, the thermoelectric element 140 or 150 may be positioned inside the body 110 and hermetically sealed, thereby preventing occurrence of a defect due to external load stress and/or thermal stress, and preventing poor performance of the capacitor due to oxidation of the thermoelectric element 140 or 150.

In an exemplary embodiment of the present disclosure, the multilayer electronic component may further include a filling portion 160 formed in a level between the connection electrode 143 or 153 disposed on one end surface of each of the first-type semiconductor element 141 or 151 and the second-type semiconductor element 142 or 152 and the connection electrode 143 or 153 disposed on the other end surface of each of the first-type semiconductor element 141 or 151 and the second-type semiconductor element 142 or 152. The filling portion 160 may cover a side of the first-type semiconductor element 141 or 151, a side of the second-type semiconductor element 142 or 152, and a side of the connection electrode 143 or 153. In addition, the filling portion 160 may cover at least a portion of the upper or lower surface of the first electrode 144 or 154 and second electrode 145 or 155. The filling portion 160 may prevent occurrence of a step difference by disposing the thermoelectric element 140 or 150 in the first and second cover portions 112 and 113. The filling portion 160 is not limited to a particular material. The filling portion 160 may use, for example, a ceramic material and a barium titanate-based ($BaTiO_3$) material included in the dielectric layer 111. However, the present disclosure is not limited thereto.

Hereinafter, the description specifically describes a method of manufacturing the multilayer electronic component according to an exemplary embodiment of the present disclosure, and the present disclosure is not limited thereto. The description of the method of manufacturing the multilayer electronic component of this exemplary embodiment omits a description overlapping the description of the multilayer electronic component described above.

FIGS. 6A through 6D are cross-sectional views each schematically showing the method of manufacturing the multilayer electronic component according to an exemplary embodiment of the present disclosure.

First, the body 110 including the dielectric layer 111 and the internal electrodes 121 and 122 may be prepared. As described above, the body 110 may be formed by stacking the plurality of ceramic green sheets on each of which the conductive paste for an internal electrode is printed on each other and then sintering the same. The body may be sintered under a reducing atmosphere in which nitrogen ($N_2$) gas and hydrogen ($H_2$) gas are mixed with each other, a temperature in which the body is sintered may be appropriately changed depending on a composition of the ceramic green sheet and a composition of the conductive paste for an internal electrode, and may be, for example, 900 to 1300° C.

Next, the plurality of connection electrodes 143 may be formed on the body 110. The connection electrode 143 may be formed by printing, on the body 110, the conductive paste including the conductive metal such as nickel (Ni) to the predetermined thickness.

Next, the plurality of first-type semiconductor elements 141 and the plurality of second-type semiconductor elements 142 may be formed on the connection electrode 143, while being spaced apart from each other. The first-type semiconductor element 141 or the second-type semiconductor element 142 may not be limited to a particular method, and may be formed, for example, by being manufactured in a chip type (or bulk type) and then disposed on the connection electrode 143. Alternatively, the first or second-type semiconductor element may be formed by applying or depositing the paste on the connection electrode 143. In this case, it is possible to reduce a thickness of the first or second-type semiconductor element. When the first or second-type semiconductor element is formed by applying the paste, the method may further include sintering the semiconductor element. A temperature in which the first or second-type semiconductor element is sintered may be appropriately changed depending on a composition of the first or second-type semiconductor element, and may be, for example, 700 to 1200° C.

Next, the filling portion 160 covering each side of the first-type semiconductor element 141, the second-type semiconductor element 142, and the connection electrode 143 may be formed. The filling portion 160 may be formed, for example, by filling a region where the connection electrode 143 is not formed in the body 110 and a region where the first or second-type semiconductor element is not formed on the connection electrode 143 with a ceramic slurry and then sintering the same.

Next, the connection electrode 143, the first electrode 144 and the second electrode 145 may be formed by printing the conductive paste on the ceramic green sheet. The first thermoelectric element 140 and the first cover portion 112 may then be formed by stacking the first electrode 144, the second electrode 145 and the connection electrode 143 for the first electrode 144 to be connected to the first-type semiconductor element 141, for the second electrode 145 to be connected to the second-type semiconductor element 142 and for the connection electrode 143 to be connected to the first or second-type semiconductor element, and sintering the same. Although not shown in the drawings, the second thermoelectric element 150 and the second cover portion 113 may be formed in a lower portion of the body 110 in the same manner as the first thermoelectric element 140.

As set forth above, the present disclosure may provide the multilayer electronic component having the improved reliability in the high-temperature environment by maintaining the constant internal temperature of the body.

While the exemplary embodiments have been shown and described above, it will be apparent to those skilled in the art that modifications and variations could be made without departing from the scope of the present disclosure as defined by the appended claims.

What is claimed is:

1. A multilayer electronic component comprising:
   a body including dielectric layers and a plurality of internal electrodes stacked on each other in a first direction, and having a respective one of the dielectric layers interposed therebetween;
   a thermoelectric element disposed inside the body; and
   external electrodes disposed outside the body and electrically connected to the thermoelectric element and the plurality of internal electrodes.

2. The multilayer electronic component of claim 1, wherein the thermoelectric element includes a first-type semiconductor element, a second-type semiconductor element, and a connection electrode connecting the first-type and second-type semiconductor elements to each other.

3. The multilayer electronic component of claim 2, wherein the thermoelectric element includes a first electrode connected to the first-type semiconductor element and a second electrode connected to the second-type semiconductor element, and the first electrode and the second electrode are respectively connected to the external electrodes.

4. The multilayer electronic component of claim 3, wherein the first electrode, the second electrode and the connection electrode each include at least one of silver (Ag), copper (Cu), nickel (Ni) or an alloy thereof.

5. The multilayer electronic component of claim 2, wherein the first-type semiconductor element is an N-type semiconductor element, and the second-type semiconductor element is a P-type semiconductor element.

6. The multilayer electronic component of claim 2, further comprising a filling portion disposed in a level between the connection electrode disposed on first end surfaces of a pair of the first-type and second-type semiconductor elements and another connection electrode disposed on second end surfaces of an adjacent pair of the first-type and second-type semiconductor elements.

7. The multilayer electronic component of claim 2, wherein the first-type or second-type semiconductor element includes perovskite oxide.

8. The multilayer electronic component of claim 1, wherein the body includes a capacitance formation portion including the plurality of internal electrodes and first and second cover portions disposed on opposite surfaces of the capacitance formation portion in the first direction, and
   the thermoelectric element is disposed in at least one of the first cover portion or the second cover portion.

9. The multilayer electronic component of claim 8, wherein the thermoelectric element includes a first thermoelectric element and a second thermoelectric element respectively disposed in the first cover portion and the second cover portion.

10. The multilayer electronic component of claim 9, wherein the first thermoelectric element and the second thermoelectric element are provided in plural, and the plurality of first thermoelectric elements and the plurality of second thermoelectric elements are respectively disposed in the first cover portion and the second cover portion.

11. The multilayer electronic component of claim 8, wherein the first and second cover portions each have a thickness of 30 μm or less.

12. The multilayer electronic component of claim 1, wherein the thermoelectric element includes a plurality of first-type semiconductor elements, a plurality of second-type semiconductor elements, and a plurality of connection electrodes respectively connecting the plurality of first-type and the plurality of second-type semiconductor elements to each other.

13. The multilayer electronic component of claim 1, wherein the thermoelectric element comprises a plurality of thermoelectric elements disposed in the body.

14. The multilayer electronic component of claim 1, wherein the thermoelectric element is not exposed to any of opposite surfaces of the body in the first direction.

15. The multilayer electronic component of claim 1, wherein each of the external electrodes includes a first electrode layer disposed on the body and including a conductive metal and glass and a second electrode layer disposed on the first electrode layer and including a conductive metal.

16. The multilayer electronic component of claim 15, wherein the second electrode layer is a multilayer including a first layer including nickel (Ni) as the conductive metal and a second layer including tin (Sn) as the conductive metal.

17. A multilayer electronic component comprising:
   a body including a capacitance formation portion having dielectric layers and a plurality of internal electrodes stacked on each other in a first direction, and having a respective one of the dielectric layers interposed therebetween, the body further including at least one cover portion disposed above or below the capacitance formation portion in the first direction;
   at least one thermoelectric element disposed in the at least one cover portion of the body; and
   external electrodes disposed outside the body and electrically connected to the at least one thermoelectric element and the plurality of internal electrodes.

18. The multilayer electronic component of claim 17, wherein the at least one thermoelectric element includes a first-type semiconductor element, a second-type semiconductor element, and a connection electrode connecting the first-type and second-type semiconductor elements to each other.

19. The multilayer electronic component of claim 18, wherein the at least one thermoelectric element further includes a first electrode connected to the first-type semiconductor element and a second electrode connected to the second-type semiconductor element, and the first electrode and the second electrode are respectively connected to the external electrodes in a second direction.

20. The multilayer electronic component of claim 19, wherein a plurality of first-type semiconductor elements and a plurality of second-type semiconductor elements are alternately connected in series by a respective one of a plurality of connection electrodes, and
semiconductor elements located at two end portions of the plurality of first-type and second-type semiconductor elements are connected to the first and second electrodes, respectively.

21. The multilayer electronic component of claim 20, wherein a set of the plurality of first-type and second-type semiconductor elements connected in series is arranged in plural, and multiple sets of the plurality of first-type and second-type semiconductor elements are arranged and spaced apart from one another in a third direction perpendicular to the first and second directions.

22. A multilayer electronic component comprising:
a body including dielectric layers and a plurality of first and second internal electrodes alternately stacked with a respective one of the dielectric layers interposed therebetween in a first direction;
external electrodes disposed outside the body and having inner surfaces respectively electrically connected to the plurality of first and second internal electrodes; and
a thermoelectric element electrically connected to the inner surfaces of the external electrodes.

23. The multilayer electronic component of claim 22, wherein the thermoelectric element comprises:
a plurality of first-type semiconductor elements and a plurality of second-type semiconductor elements;
a plurality of connection electrodes; and
a first electrode and a second electrode,
wherein the plurality of first-type semiconductor elements and the plurality of second-type semiconductor elements are alternately connected in series by a respective one of the plurality of connection electrodes, and
wherein the first and second electrodes connected to opposing end portions of the plurality of first-type and second-type semiconductor elements are connected to the inner surfaces of the external electrodes, respectively.

24. The multilayer electronic component of claim 22, wherein the body further includes cover portions respectively disposed above and below a stacked structure of the plurality of first and second internal electrodes in the first direction, and
the thermoelectric element is disposed in at least one of the cover portions.

25. The multilayer electronic component of claim 24, wherein the thermoelectric element is in plural, and the plurality of thermoelectric elements are disposed in both of the cover portions.

* * * * *